(12) United States Patent
Lee et al.

(10) Patent No.: US 9,818,973 B2
(45) Date of Patent: Nov. 14, 2017

(54) DISPLAY DEVICE

(71) Applicant: SAMSUNG DISPLAY CO., LTD., Yongin-si, Gyeonggi-do (KR)

(72) Inventors: Hyesog Lee, Osan-si (KR); Jaejoong Kwon, Suwon-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 15/051,443

(22) Filed: Feb. 23, 2016

(65) Prior Publication Data

US 2016/0365402 A1    Dec. 15, 2016

(30) Foreign Application Priority Data

Jun. 15, 2015 (KR) .................. 10-2015-0084120

(51) Int. Cl.
*H01L 51/52* (2006.01)
*G02B 27/26* (2006.01)
*H04M 1/02* (2006.01)

(52) U.S. Cl.
CPC .......... *H01L 51/5237* (2013.01); *G02B 27/26* (2013.01); *H01L 51/5271* (2013.01); *H04M 1/02* (2013.01); *H01L 51/5256* (2013.01); *H01L 51/5284* (2013.01); *H01L 2227/323* (2013.01)

(58) Field of Classification Search
CPC ............... H01L 27/323; H01L 27/3272; H01L 51/5253; H01L 51/5284; H01L 51/5293
See application file for complete search history.

(56) References Cited

U.S. PATENT DOCUMENTS

| | | | |
|---|---|---|---|
| 8,093,804 B2 | 1/2012 | Lee et al. | |
| 8,599,149 B2 * | 12/2013 | Lee ........................ | G06F 3/0412 345/173 |
| 2005/0263775 A1 * | 12/2005 | Ikeda .................... | G09G 3/3291 257/79 |
| 2006/0290271 A1 * | 12/2006 | Cok ..................... | H01L 51/5259 313/504 |
| 2007/0131944 A1 * | 6/2007 | Hu ......................... | H01L 25/048 257/81 |
| 2007/0201234 A1 | 8/2007 | Ottermann | |
| 2010/0244682 A1 * | 9/2010 | Lee ....................... | H01L 27/323 313/512 |
| 2013/0100258 A1 | 4/2013 | Kim et al. | |
| 2013/0241402 A1 * | 9/2013 | Wang ..................... | H05B 33/04 313/504 |

(Continued)

FOREIGN PATENT DOCUMENTS

| KR | 10-2011-0056897 A | 5/2011 |
|---|---|---|
| KR | 10-2012-0010402 A | 2/2012 |

(Continued)

*Primary Examiner* — Allan R Wilson
(74) *Attorney, Agent, or Firm* — Lewis Roca Rothgerber Christie LLP

(57) ABSTRACT

There is provided a display device including a display panel configured to display an image, a window above the display panel and including a display area configured to transmit an image therethrough, a non-display area around the display area, a window base facing the display panel, a printed layer below the window base, and a low refractive-index zone between the window base and the printed layer, and an adhesive layer between the display panel and the window.

19 Claims, 13 Drawing Sheets

(56) References Cited

U.S. PATENT DOCUMENTS

| | | |
|---|---|---|
| 2014/0021499 A1 | 1/2014 | Jang |
| 2014/0145979 A1 | 5/2014 | Lee |
| 2014/0315463 A1 | 10/2014 | Khachatryan |
| 2014/0339517 A1 | 11/2014 | Park et al. |
| 2016/0377770 A1* | 12/2016 | Kwon ..................... G02B 5/09 |
| | | 359/599 |

FOREIGN PATENT DOCUMENTS

| | | |
|---|---|---|
| KR | 10-2013-0014325 A | 2/2013 |
| KR | 10-2013-0043966 A | 5/2013 |
| KR | 10-2014-0040974 A | 4/2014 |
| KR | 10-2014-0073317 A | 6/2014 |
| KR | 10-2014-0080256 A | 6/2014 |

\* cited by examiner (b) (a)

DISPLAY DEVICE

CROSS-REFERENCE TO RELATED APPLICATION

This application claims priority to, and the benefit of, Korean Patent Application No. 10-2015-0084120, filed on Jun. 15, 2015, with the Korean Intellectual Property Office ("KIPO"), the disclosure of which is incorporated herein in its entirety by reference.

BACKGROUND

1. Field

Aspects of embodiments of the present invention relate to a display device.

2. Description of the Related Art

It is to be understood that this background section is intended to provide useful background for understanding the technology and, as such, the background section may include ideas, concepts, or recognitions that were not part of what was known or appreciated by those skilled in the pertinent art prior to a corresponding effective filing date of subject matter disclosed herein.

SUMMARY

Aspects of embodiments of the present invention are directed to a display device exhibiting improved (e.g., a reduced) light leakage caused by total reflection.

According to some exemplary embodiments of the present invention, there is provided a display device including: a display panel configured to display an image; a window above the display panel and including: a display area configured to transmit an image therethrough; a non-display area around the display area; a window base facing the display panel; a printed layer below the window base; and a low refractive-index zone between the window base and the printed layer; and an adhesive layer between the display panel and the window.

In an embodiment, the low refractive-index zone includes an air layer.

In an embodiment, the window further includes a base film between the window base and the printed layer.

In an embodiment, the window further includes an optically clear adhesive ("OCA") layer between the window base and the base film.

In an embodiment, the low refractive-index zone is at a same layer as the OCA layer.

In an embodiment, the low refractive-index zone is above the OCA layer.

In an embodiment, the low refractive-index zone is between the display panel and the adhesive layer.

In an embodiment, the low refractive-index zone covers an entire surface of the adhesive layer.

In an embodiment, the low refractive-index zone includes a material having a low refractive index.

In an embodiment, the display device further includes a light absorbing member on a side surface of the window.

In an embodiment, the light absorbing member includes a base resin, a light absorbing material, and a UV-curing accelerator.

In an embodiment, the printed layer is at the non-display area, and contacts the adhesive layer.

In an embodiment, the printed layer includes a first decor printing layer, and a light blocking printed layer.

In an embodiment, the light blocking printed layer contacts the adhesive layer.

In an embodiment, the first decor printed layer includes a white printed layer.

In an embodiment, the light blocking printed layer includes a black printed layer.

In an embodiment, the display panel includes: a first substrate; a capping layer on the first substrate; and a thin film encapsulation ("TFE") layer on the capping layer.

In an embodiment, the display device further includes a polarizer on the TFE layer, and facing the window base.

In an embodiment, the adhesive layer is between the polarizer and the window.

In an embodiment, the display device further includes a touch screen panel ("TSP") on the polarizer.

The foregoing is illustrative only, and is not intended to be in any way limiting. In addition to the illustrative aspects, embodiments, and features described above, further aspects, embodiments, and features will become apparent by reference to the drawings and the following detailed description.

BRIEF DESCRIPTION OF THE DRAWINGS

The above and other aspects of the present disclosure of invention will be more clearly understood from the following detailed description taken in conjunction with the accompanying drawings, in which.

DETAILED DESCRIPTION

Figure 1:
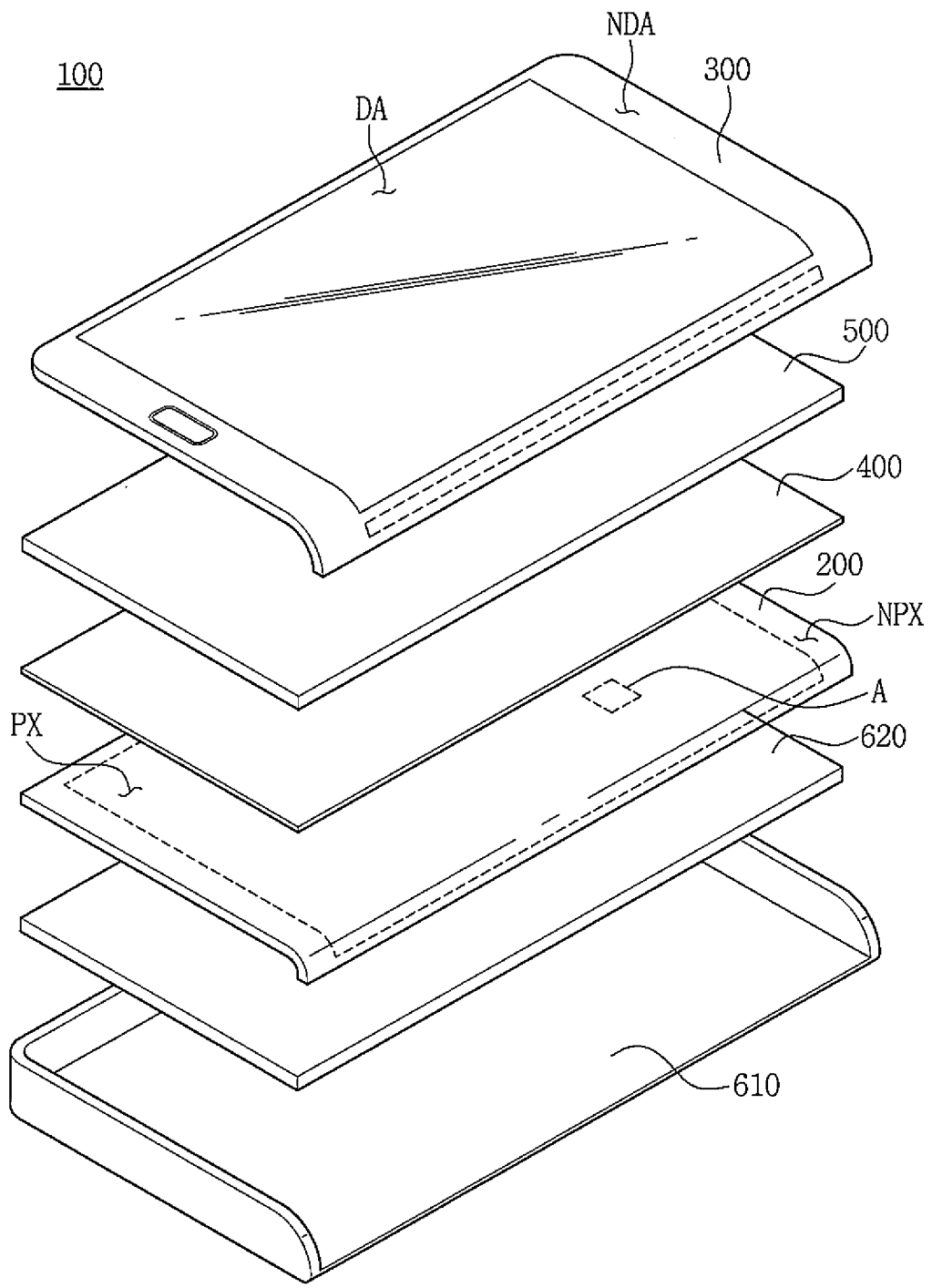
FIG. 1 is an exploded perspective view illustrating a display device according to an exemplary embodiment of the present invention.

Aspects and features of the present invention and methods for achieving them will be made clear from embodiments described below in detail with reference to the accompanying drawings. The present invention may, however, be embodied in many different forms and should not be construed as being limited to the embodiments set forth herein. Rather, these embodiments are provided so that this disclosure will be thorough and complete, and will fully convey the scope of the invention to those skilled in the art. The present invention is merely defined by the scope of the claims. Therefore, well-known constituent elements, operations, and techniques are not described in detail in the embodiments in order to prevent the present invention from being obscurely interpreted. Like reference numerals refer to like elements throughout the specification.

It will be understood that, although the terms "first", "second", "third", etc., may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section discussed below could be termed a second element, component, region, layer or section, without departing from the spirit and scope of the inventive concept.

The terminology used herein is for the purpose of describing particular example embodiments only and is not intended to be limiting. As used herein, the singular forms "a" and "an" are intended to include the plural forms as well, unless the context clearly indicates otherwise. Throughout the specification, when an element is referred to as being "connected" to another element, the element is "directly connected" to the other element, or "electrically connected" to the other element with one or more intervening elements interposed therebetween. It will be further understood that the terms "comprises," "comprising," "includes" and/or "including," when used in this specification, specify the presence of stated features, integers, steps, operations, elements, and/or components, but do not preclude the presence or addition of one or more other features, integers, steps, operations, elements, components, and/or groups thereof.

Expressions such as "at least one of," when preceding a list of elements, modify the entire list of elements and do not modify the individual elements of the list. Further, the use of "may" when describing embodiments of the inventive concept refers to "one or more embodiments of the inventive concept." Also, the term "exemplary" is intended to refer to an example or illustration.

In the drawings, the thickness of layers and regions may be exaggerated for clarity. In addition, when a layer is described to be formed on another layer or on a substrate, this means that the layer may be directly formed on the other layer or on the substrate, or a third layer may be interposed between the layer and the other layer or the substrate. It will be understood that when an element such as a layer, film, region, or substrate is referred to as being "on" another element, it can be directly on the other element or intervening elements may also be present. In contrast, when an element is referred to as being "directly on" another element, there are no intervening elements present. In addition, it will also be understood that when a layer is referred to as being "between" two layers, it can be the only layer between the two layers, or one or more intervening layers may also be present.

As used herein, the term "substantially," "about," and similar terms are used as terms of approximation and not as terms of degree, and are intended to account for the inherent variations in measured or calculated values that would be recognized by those of ordinary skill in the art.

As used herein, the terms "use," "using," and "used" may be considered synonymous with the terms "utilize," "utilizing," and "utilized," respectively.

Hereinbelow, a display device is described as an organic light emitting diode ("OLED") display device including an organic light emitting layer, however, the present invention is not limited thereto. For example, the display device according to the present invention may be a liquid crystal display ("LCD") device, a plasma display panel ("PDP") device, or a field emission display ("FED") device.

Further, accompanying drawings illustrate an active-matrix type organic light emitting diode (AMOLED) device having a 2Tr-1Cap structure, which includes two thin film transistors ("TFT") and a capacitor in each pixel by way of example; however, the present invention is not limited thereto. Accordingly, the number of TFTs, the number of capacitors, and the number of wirings may not be particularly limited in the organic light emitting diode ("OLED") display device. Herein, the term "pixel" refers to the smallest unit for displaying an image, and the OLED display device may display an image using a plurality of pixels.

Unless otherwise defined, all terms used herein (including technical and scientific terms) have the same meaning as commonly understood by those skilled in the art to which this invention pertains. It will be further understood that terms, such as those defined in commonly used dictionaries, should be interpreted as having a meaning that is consistent with their meaning in the context of the relevant art and will not be interpreted in an ideal or excessively formal sense unless clearly defined in the present specification.

Hereinafter, a display device according to an exemplary embodiment will be described in detail with reference to FIGS. 1, 2, and 3.

FIG. 1 is an exploded perspective view illustrating a display device according to an exemplary embodiment of the present invention.

In reference to FIG. 1, a display device 100 includes a display panel 200 on which a pixel region PX and a non-pixel region NPX are defined, a housing 610 accommodating the display panel 200, an impact absorbing sheet 620 between the display panel 200 and the housing 610, a window 300 on which a display area DA and a non-display area NDA are defined, and an adhesive layer 500 between the display panel 200 and the window 300. The window 300 is disposed on the display panel 200.

The non-pixel region NPX is formed around the pixel region PX, and the non-display area NDA is formed around the display area DA. The pixel region PX of the display panel 200 corresponds to the display area DA of the window 300, and the non-pixel region NPX of the display panel 200 corresponds to the non-display area NDA of the window 300. In FIG. 1, for ease of description, the housing 610, the display panel 200, the window 300, and the adhesive layer 500 are illustrated as being separated from each other.

The pixel region PX of the display panel 200 may be defined as an area for generating an image and for displaying the image. The non-pixel region NPX of the display panel 200 may be defined as an area that does not generate an image. The image generated in the display panel 200 may be transmitted through the window 300 to be displayed to a user.

The display panel 200 is not particularly limited. For example, the display panel 200 may be a self-emission-type display panel, such as an OLED display panel, or may be a non-emission-type display panel, such as an LCD panel or an electrophoretic display panel ("EPD"). The display panel 200 will be described further below with reference to FIG. 7.

The housing 610 accommodates the display panel 200. In FIG. 1, the housing 610 formed of a single unit that provides a space for accommodating the display panel 200 is described by way of example. However, in an alternative exemplary embodiment, the housing 610 may have a structure in which two or more units may be coupled to one another.

The housing 610 may further include a circuit board on which a driving element is mounted in addition to the display panel 200. Further, the housing 610 may further include a power unit, such as a battery.

The impact absorbing sheet 620 is disposed between the display panel 200 and the housing 610 to absorb impact that may be imposed to the display panel 200. Accordingly, the impact absorbing sheet 620 may prevent or substantially prevent an external shock from being directly applied to the display panel 200. The impact absorbing sheet 620 may be omitted.

The window 300 is on a side of the display panel 200 at which the image is displayed, and is coupled to the housing 610 to form an exterior surface of the display device 100, along with the housing 610.

A polarizer 400 is disposed on the display panel 200, and in more detail, is between the display panel 200 and the adhesive layer 500. The polarizer 400 may convert an optical axis of light emitted from the display panel 200.

The polarizer 400 may be disposed on the display panel 200 to cover at least a portion of the display panel 200. Alternatively, the polarizer 400 may be formed to have substantially the same size as the size of the display panel 200 to cover an entire surface of the display panel 200. The polarizer 400 may have a monolayer, or may include a plurality of layers including a polarizing film and a phase retardation film.

Figure 3:
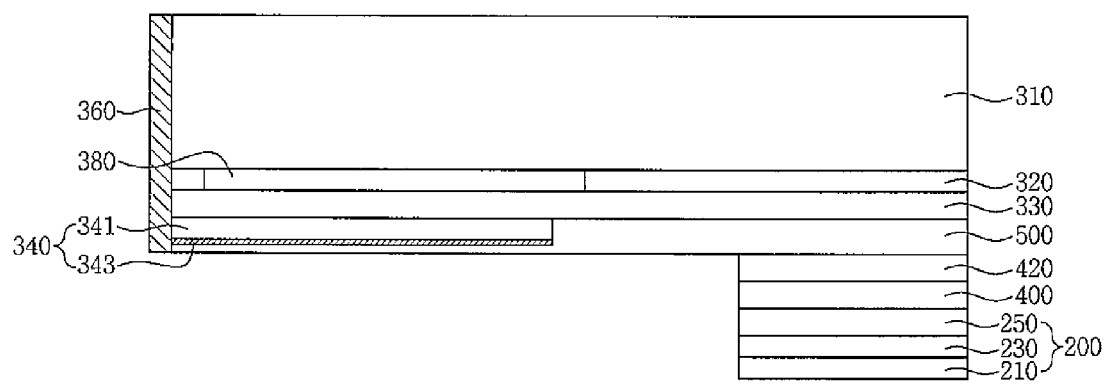
FIG. 3 is a cross-sectional view illustrating the display device according to an exemplary embodiment of the present invention.

In reference to FIGS. 1 and 3, the display device 100 may further include a touch screen panel 420 (see FIG. 3). The touch screen panel 420 may be disposed on the display panel 200. For example, the touch screen panel 420 may be disposed on the polarizer 400, or may be between the display panel 200 and the polarizer 400. Based on an input signal applied from the touch screen panel 420, the display panel 200 may display an image corresponding to the input signal to a user.

Hereinafter, the window 300 will be described in further detail with reference to FIGS. 2 and 3.

Figure 2:
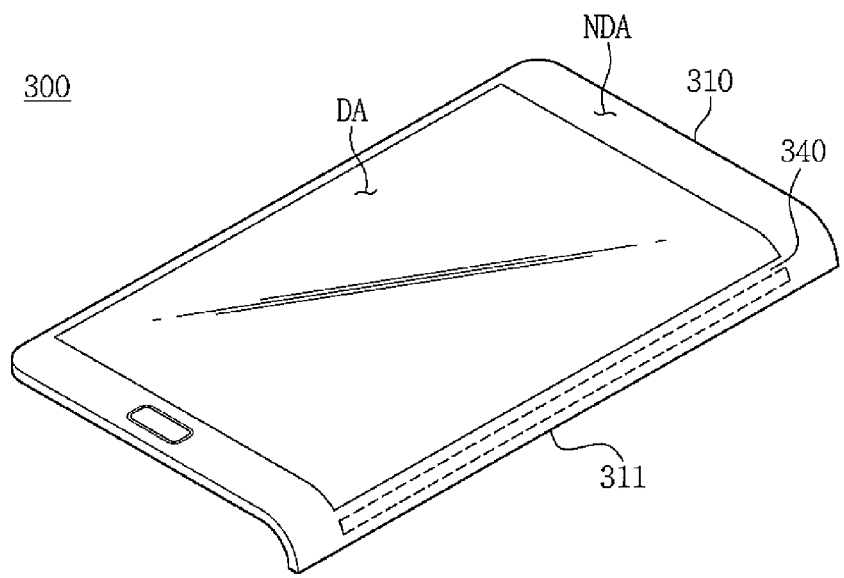
FIG. 2 is a perspective view illustrating a window of FIG. 1.

FIG. 2 is a perspective view illustrating the window 300 of FIG. 1. FIG. 3 is a cross-sectional view illustrating the display device according to the present embodiment. The housing 610 and the impact absorbing sheet 620 are omitted in FIG. 3 for ease of illustration.

The window 300 is disposed on the display panel 200 to protect the display panel 200 from external scratches.

An upper planar surface of the window 300 includes a display area DA, and includes a non-display area NDA formed around the display area DA. The display area DA may be defined as an area in which an image is displayed to an observer. The non-display area NDA may be defined as an area in which an image is not displayed. The non-display area NDA may be printed in black. However, the printing color of the non-display area NDA is not limited thereto, and the non-display area NDA may be printed in various suitable colors other than black. For example, in an alternative exemplary embodiment, the non-display area NDA may be printed in white.

The window 300 may include a window base 310, a printed layer 340, and a low refractive-index zone 380 between the window base 310 and the printed layer 340.

The window base 310 faces the display panel 200. A planar area of the window base 310 includes a display area DA, and includes a non-display area NDA around the display area DA, as in the planar area of the window 300.

The window base 310 may include a transparent film that may transmit light. Accordingly, the image generated in the pixel region PX of the display panel 200 may be transmitted through the window base 310 in the display area DA to be displayed to a user.

In addition, the window base 310 may include or may be formed of plastic or glass having shock-resistance properties. The window base 310 may have a quadrangular plate shape, and a portion around angular points of the quadrangular plate shape may be roundly shaped. The window base 310 illustrated in FIG. 2 has a structure in which a right edge portion 311 is curved. However, the present invention is not limited thereto, and the window base 310 may have various suitable shapes, including a curved corner portion, a curved left edge portion, and/or the like.

A hard coating layer or a passivation layer may be disposed on the window base 310.

The hard coating layer may use any coating composition that may enhance the surface hardness of the window base 310, and in particular, may use an ultraviolet (UV) curable coating composition that may not require a high-temperature treatment. The hard coating layer may include an acrylate-based monomer or an inorganic chemical compound. The hard coating layer may enhance the surface hardness of the window base 310, and may also enhance chemical-resistance properties.

The passivation layer may be disposed on the hard coating layer. The passivation layer may be a functional coating layer including an anti-finger (AF) coating layer, an anti-reflection (AR) coating layer, and an anti-glare (AG) coating layer.

The printed layer 340 is on a lower surface of the window base 310 facing the display panel 200 in the non-display area NDA. That is, the non-display area NDA corresponds to an area in which the printed layer 340 is disposed, and the display area DA corresponds to an area in which the printed layer 340 is absent.

In reference to FIG. 3, a base film 330 below the window base 310, an optically clear adhesive layer ("OCA") layer 320 between the window base 310 and the base film 330, and the low refractive-index zone 380 may be provided.

The base film 330 may be a transparent film, such as a polyethylene terephthalate (PET) film or the like. However, any transparent film that may transmit light may be used without limitation.

The OCA layer 320 may allow the window base 310 and the base film 330 to be coupled to each other. Because the OCA layer 320 is transparent, it may not diminish luminance of light emitted from the display panel 200.

The low refractive-index zone 380 is between the window base 310 and the printed layer 340, and changes a path of light. For example, the low refractive-index zone 380 changes a path of totally reflected light that causes light leakage so as to prevent or substantially prevent the totally reflected light from reaching the printed layer 340.

As illustrated in FIG. 3, the low refractive-index zone 380 may be at the same layer as the OCA layer 320 between the window base 310 and the printed layer 340. For example, the low refractive-index zone 380 may be between the window base 310 and the base film 330. However, the present invention is not limited thereto, and the low refractive-index zone 380 may have various suitable structures and positions that may control the path of the totally reflected light to prevent or substantially prevent the totally reflected light from reaching the printed layer 340. For example, the low refractive-index zone 380 may be formed on the OCA layer 320.

The low refractive-index zone 380 may include a material having a low refractive index. For example, the low refractive-index zone 380 may be a layer filled with air, vacuum, or aerogel. The aerogel is a solid material in which air accounts for about 98% or more, and has a considerably low refractive index of about 1.01 or less.

The low refractive-index zone 380 may be formed in a method in which a portion of the OCA layer 320 is removed to dispose an air layer between the window base 310 and the base film 330. However, the present invention is not limited thereto, and the low refractive-index zone 380 may be formed by performing etching or deposition on an interface between the window base 310 and the OCA layer 320 using a mask or a photoresist so as to dispose the air layer above the OCA layer 320.

As illustrated in the foregoing, the totally reflected light reaching the low refractive-index zone 380 between the window base 310 and the printed layer 340 is totally reflected once again by the low refractive-index zone 380, and thereby the path of the totally reflected light may be changed. That is, because the low refractive-index zone 380 changes the light path, the totally reflected light causing light leakage may be prevented or substantially prevented from reaching the printed layer 340.

The changed path of the totally reflected light and effects of light leakage improvement (e.g., reduction) by virtue of the low refractive-index zone 380 included in the display device according to the present embodiment will be described further below with reference to FIGS. 4 and 5.

In reference to FIG. 3, a light absorbing member 360 may further be provided in the display device according to the present embodiment.

The light absorbing member 360 is disposed on a side surface of the window 300, and absorbs the light having the changed light path (due to the low refractive-index zone 380) to cause light extinction. In this case, light that is not absorbed by the light absorbing member 360 may be totally reflected once again to be absorbed by the polarizer 400. Accordingly, the light absorbing member 360 may significantly improve (e.g., reduce) the effect of light leakage.

Figure 5:
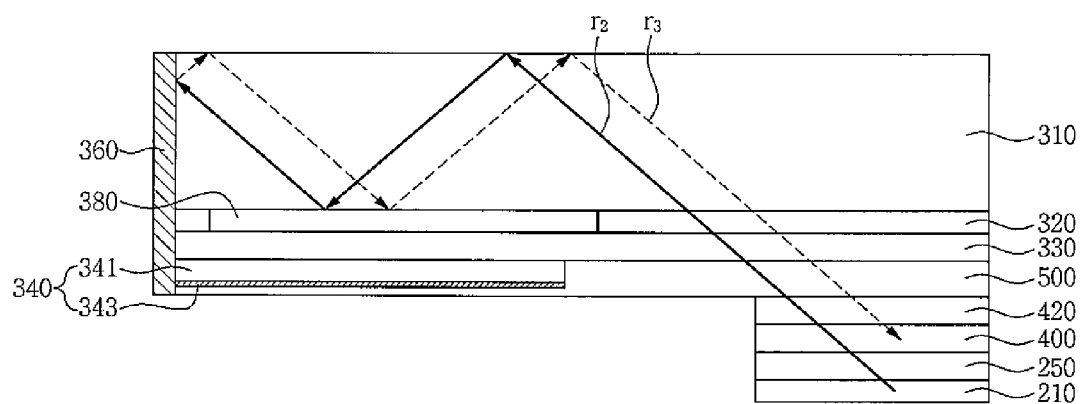
FIG. 5 is a cross-sectional view illustrating a path of totally reflected light in the display device according to an exemplary embodiment of the present invention.

As illustrated in FIG. 5, the light absorbing member 360 is disposed over side surfaces of the window base 310, the OCA layer 320, the base film 330, and the printed layer 340. However, the present invention is not limited thereto, and the light absorbing member 360 may be omitted.

The light absorbing member 360 may include a base resin, a light absorbing material, a UV-curing accelerator, and/or the like.

The base resin is a main material that is to be combined with the light absorbing material and the UV-curing accelerator to form a base of the light absorbing member 360. The base resin may include an acrylate-based polymer and/or the like.

The light absorbing material prevents or substantially prevents light leakage. That is, the light absorbing material may perform a primary function of the light absorbing member 360. The light absorbing material may include colored particles.

The UV-curing accelerator is a material that may facilitate UV curing of the base resin. As the light absorbing member 360 includes the UV-curing accelerator, the base resin may be readily cured in spite of increasing a black level of the light absorbing member 360.

The printed layer 340 may be on a surface of the base film 330 in the non-display area NDA. The printed layer 340 may prevent or substantially prevent a driving unit (for driving the display panel 200) and an accommodation unit (for accommodating the display panel 200) from being externally visible.

The printed layer 340 may include an organic material having a color (e.g., a preset or predetermined color). Accordingly, a color of the printed layer 340 may be visible to a user in the non-display area NDA of the window base 310.

The printed layer 340 may have various suitable colors including a black color or a white color. In a case where the printed layer 340 has a black color, the printed layer 340 may include a black matrix. In a case where the printed layer 340 has a white color, the printed layer 340 may include an organic insulating material, such as a white resin. In addition, the printed layer 340 may include an opaque inorganic insulating material such as $CrO_x$, $MoO_x$, and/or an opaque organic insulating material such as a black resin. Accordingly, the printed layer 340 may serve to block light in the display panel 200, to prevent or reduce the visibility of an inner structure of the display panel 200, and to determine a color of the window 300.

The printed layer 340 may be formed by printing a printing composition on a base film 330, and by attaching the base film 330 formed with the printed layer 340 to the window base 310. However, the method of forming the printed layer 340 on the base film 330, and the method of disposing the manufactured film to a surface of the window base 310, are not limited to the method described in the foregoing, and various suitable methods may be applicable.

The printed layer 340 may be formed into a monolayer, however, embodiments of the present invention are not limited thereto. The printed layer 340 may include a plurality of layers each having the same or substantially the same thickness or a plurality of layers respectively having different colors.

In reference to FIG. 3, the printed layer 340 includes two printed layers 341 and 343. The printed layers 341 and 343 include a first decor printed layer 341 and a light blocking printed layer 343 on a surface of the base film 330 in the non-display area NDA.

The first decor printed layer 341 may be a white printed layer, however, the present invention is not limited thereto. In alternative exemplary embodiments, the first decor printed layer 341 may have various suitable colors other than black. Although described as having a single layer, the first decor printed printing layer 341 may have a plurality of layers having the same color to provide a more distinct color.

The light blocking printed layer 343 may be a black printed layer. The light blocking printed layer 343 having a black color may have a light blocking level higher than that of the first decor printed layer 341.

Two printed layers 341 and 343 are described in FIG. 3 by way of example, however, the present invention is not limited thereto. In alternative exemplary embodiments, more than two printed layers may be disposed on one surface of the base film 330 in the non-display area NDA.

The printed layer 340 may contact the adhesive layer 500 interposed between the display panel 200 and the window 300.

The adhesive layer 500 is between the polarizer 400 and the window 300, and may allow the display panel 200 and the window 300 to be firmly coupled (or fixed) to each other.

To prevent or substantially prevent a decrease in luminance of the light emitted from the display panel 200, the adhesive layer 500 may have a transparent property. The adhesive layer 500 may include a transparent polymer resin, having adhesion, which may be cured by light or heat. For example, the adhesive layer 500 may be formed of a photo-curable resin that may be cured by light irradiation.

Hereinafter, the effect of light leakage improvement (e.g., reduction) according to the present invention will be described further with reference to FIGS. 4 and 5.

Figure 4:
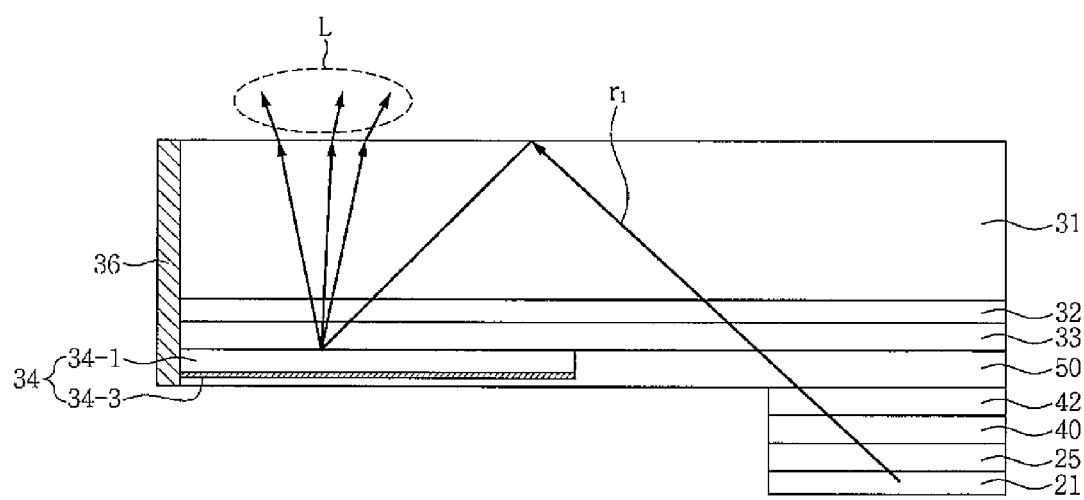
FIG. 4 is a cross-sectional view illustrating a path of totally reflected light in a related display device.

FIG. 4 is a cross-sectional view illustrating a path of totally reflected light in a related display device. FIG. 5 is a cross-sectional view illustrating a path of totally reflected light in the display device according to the present embodiment. In FIGS. 4 and 5, the housing 610 and the impact absorbing sheet 620 are omitted.

A window of a related display device illustrated in FIG. 4 includes a window base 31 and a printed layer 34 below the window base 31. In further detail, the window base 31, an OCA layer 32, a base film, and the printed layer 34 are sequentially disposed, and a light absorbing member 36 is further provided on a side surface of the window.

In reference to FIG. 4, a totally reflected light $r_1$ that is generated in an OLED 21 to reach a surface of the window base 31 is guided to reach the printed layer 34. The light $r_1$ reaching the printed layer 34 is scattered at the printed layer 34 to be emitted as light leakage L.

The window 300 according to the present embodiment illustrated in FIG. 5 includes the window base 310, the OCA layer 320, the base film 330, the printed layer 340, the low refractive-index zone 380 between the window base 310 and the base film 330, and the light absorbing member 360 on a side surface of the window 300.

Thus, as compared to the related display device, the display device according to the present embodiment further includes the low refractive-index zone 380.

The low refractive-index zone 380 is disposed between the window base 310 and the printed layer 340, and serves to change a light path.

In reference to FIG. 5, the low refractive-index zone 380 may include a material having a low refractive index. For example, the low refractive-index zone 380 may be a layer filled with air, vacuum, aerogel, or the like. The totally reflected light reaching the low refractive-index zone 380 is totally reflected once again, such that a light path thereof is changed. That is, the low refractive-index zone 380 changes the light path of the totally reflected light to prevent or substantially prevent the totally reflected light causing light leakage from reaching the printed layer 340.

In further detail, a totally reflected light $r_2$ that is generated from the OLED 210 to reach a surface of the window base 310 may not reach the printed layer 340 because the light path of the totally reflected light $r_2$ is changed by the low refractive-index zone 380 between the window base 310 and the base film 330. The light $r_2$ that fails to reach the printed layer 340 due to a changed light path may be absorbed by the light absorbing member 360 to become extinct. Accordingly, the light leakage phenomenon occurring in the non-display area of the window 300 may be improved (e.g., reduced) or prevented.

Further, a light $r_3$ that is not absorbed by the light absorbing member 360 (e.g., remaining light $r_3$) may repeat total reflection so as to be absorbed by the polarizer 400. Accordingly, the light absorbing member 360 may significantly improve (e.g., reduce) the effect of light leakage.

As described in the foregoing, the display device according to the present embodiment further includes the low refractive-index zone 380, such that totally reflected light causing the light leakage may not reach the printed layer 340. Accordingly, the display device according to the present embodiment may have the effect of light leakage improvement (e.g., the effect of light leakage reduction).

Hereinafter, a pixel of the display panel 200 will be described with reference to FIGS. 6 and 7.

Figure 6:
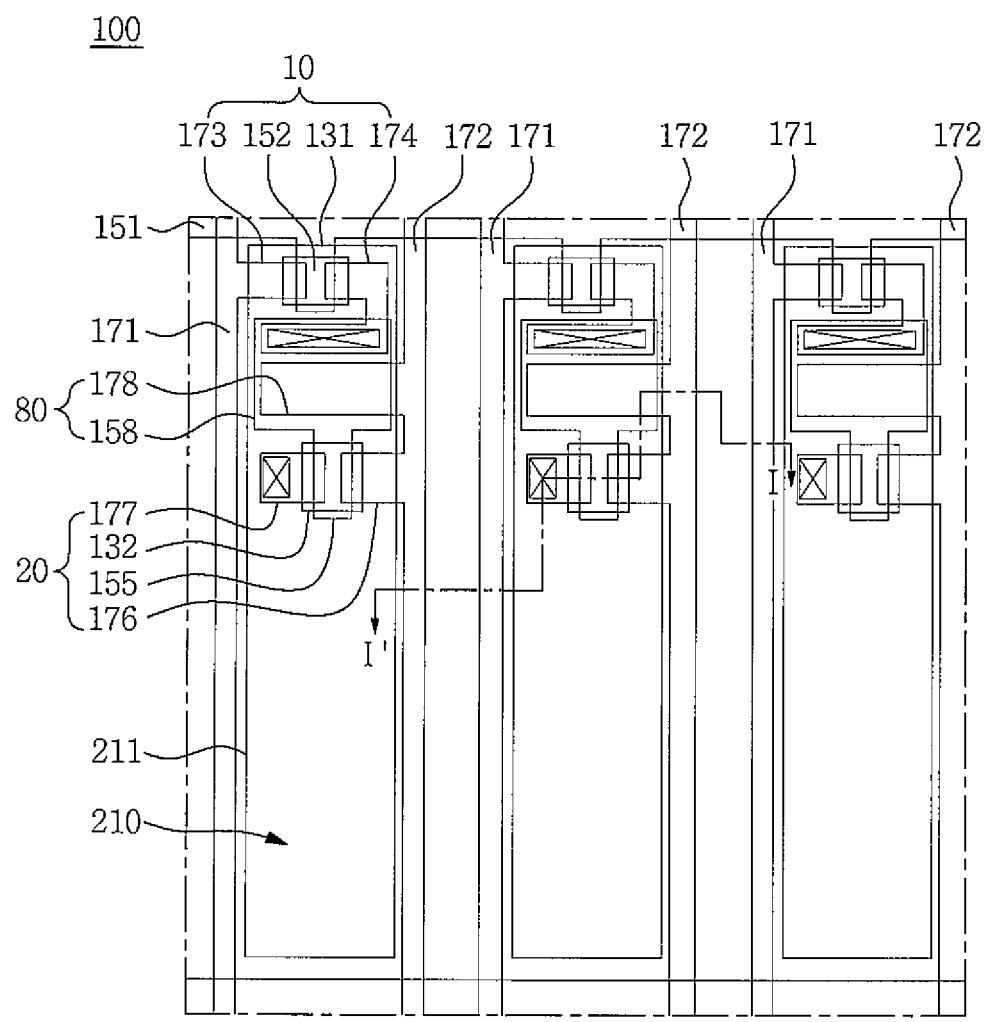
FIG. 6 is a plan view illustrating a pixel of the display panel in a portion A of FIG. 1.

FIG. 6 is a plan view illustrating a pixel in portion A of FIG. 1. FIG. 7 is a cross-sectional view taken along the line I-I' of FIG. 6.

Figure 7:
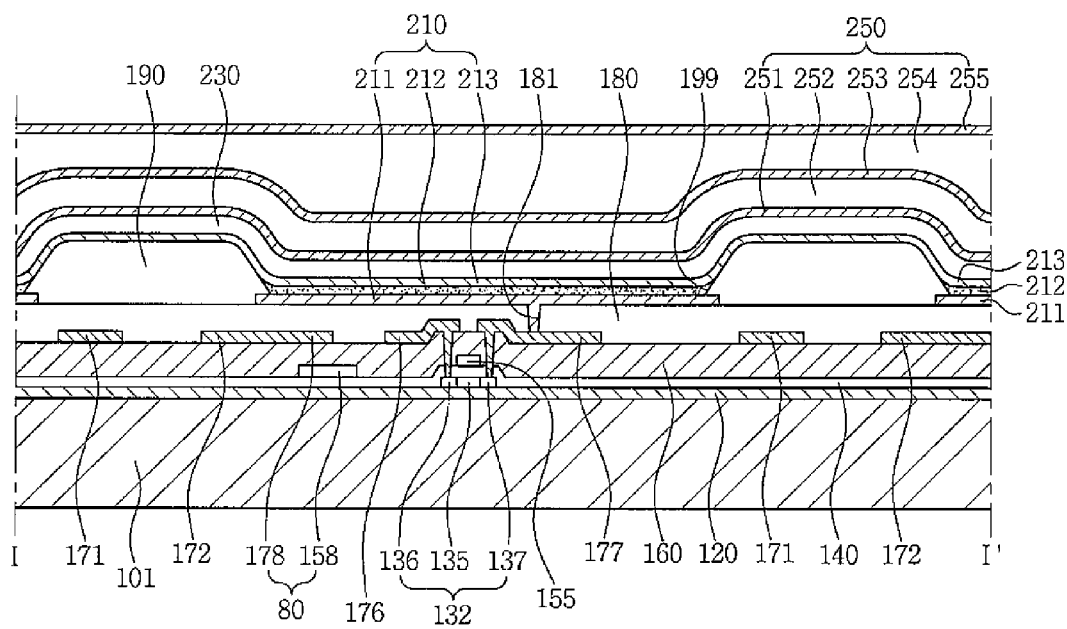
FIG. 7 is a cross-sectional view taken along the line I-I' of FIG. 6.

FIGS. 6 and 7 illustrate an active-matrix type organic light emitting diode (AMOLED) device having a 2Tr-1Cap structure including two thin film transistors ("TFT") 10 and 20 and a capacitor 80 in each pixel in the display area DA (e.g., refer to FIG. 1) by way of example; however, the present invention is not limited thereto.

For example, the OLED display device 100 may include three or more TFTs and two or more capacitors 80 in each pixel, and may further include additional wirings to have various suitable configurations. Herein, the term "pixel" refers to a smallest unit for displaying an image, and the display area displays an image using a plurality of pixels.

The OLED display device 100 according to the present embodiment includes the first substrate 101 and a plurality of pixels defined on the first substrate 101. Each pixel includes the switching TFT 10, the driving TFT 20, the capacitor 80, and an OLED 210. Further, the first substrate 101 may further include a gate line 151 disposed along a direction, and a data line 171 and a common power line 172 insulated from and crossing the gate line 151.

Herein, each pixel may be defined by the gate line 151, the data line 171, and the common power line 172, however, the definition is not limited thereto.

The OLED 210 includes a first electrode 211, an organic light emitting layer 212 on the first electrode 211, and a second electrode 213 on the organic light emitting layer 212. Herein, at least one first electrode 211 may be formed on each pixel, and thus the first substrate 101 may include a plurality of first electrodes 211 spaced apart from each other.

Herein, the first electrode 211 may be a positive end (anode) serving as a hole injection electrode, and the second electrode 213 may be a negative end (cathode) serving as an electron injection electrode. However, the present invention is not limited thereto. For example, the first electrode 211 may be a cathode, and the second electrode 213 may be an anode, based on the driving scheme of the OLED display device 100. Further, the first electrode 211 may be a pixel electrode, and the second electrode 213 may be a common electrode.

The holes and electrons injected to the organic light emitting layer 212 are combined with each other to form an exciton, and then light is emitted by energy generated when the exciton falls from an excited state to a ground state.

The capacitor 80 may include a pair of storage electrodes 158 and 178 with an insulating layer 160 interposed therebetween. Herein, the insulating layer 160 may include a dielectric material. The capacitance of the capacitor 80 is determined by electric charges accumulated in the capacitor 80, and by voltage across the pair of storage electrodes 158 and 178.

The switching TFT 10 includes a switching semiconductor layer 131, a switching gate electrode 152, a switching source electrode 173, and a switching drain electrode 174. The driving TFT 20 includes a driving semiconductor layer 132, a driving gate electrode 155, a driving source electrode 176, and a driving drain electrode 177.

The switching TFT 10 may function as a switching element that selects a pixel to perform light emission. The switching gate electrode 152 is connected to the gate line 151, and the switching source electrode 173 is connected to the data line 171. The switching drain electrode 174 is spaced apart from the switching source electrode 173, and is connected to the first storage electrode 158.

The driving TFT 20 may apply a driving power to the first electrode 211, which allows the organic light emitting layer 212 of the OLED 210 in a selected pixel to emit light. The driving gate electrode 155 is connected to the first storage electrode 158, which is connected to the switching drain electrode 174. The driving source electrode 176 and the second storage electrode 178 are connected to the common power line 172, respectively.

The driving drain electrode 177 is connected to the first electrode 211 of the OLED 210 through a drain contact hole (e.g., contact opening) 181.

With the above-described configuration, the switching TFT 10 may be operated by a gate voltage applied to the gate line 151, and may function to transmit a data voltage applied to the data line 171 to the driving TFT 20.

Voltage equivalent to a difference between a common voltage (applied from the common power line 172 to the driving TFT 20) and the data voltage (transmitted from the switching TFT 10) may be stored in the capacitor 80, and current corresponding to the voltage stored in the capacitor 80 may flow to the OLED 210 through the driving TFT 20, so that the OLED 210 may emit light.

The configuration of the OLED display device 100 according to the present embodiment will be described further with reference to FIG. 7 along with FIG. 6.

The OLED 210, the driving TFT 20, the capacitor 80, the data line 171, and the common power line 172 illustrated in FIG. 7 will be described below. Further, the switching semiconductor layer 131, the switching gate electrode 152, the switching source and drain electrodes 173 and 174 of the switching TFT 10 may have the same or substantially the same stacked structure as that of the driving semiconductor layer 132, the driving gate electrode 155, the driving source and drain electrodes 176 and 177 of the driving TFT 20, and thus a repeated description may not be provided.

According to the present exemplary embodiment, the first substrate 101 may include an insulating substrate formed of glass, quartz, ceramic, plastic, or the like. However, the present invention is not limited thereto, and the first substrate 101 may include a metal substrate including stainless steel or the like.

A buffer layer 120 is formed on the first substrate 101. The buffer layer 120 may efficiently reduce infiltration of undesirable elements and may planarize a surface, and may include various suitable materials in accordance therewith.

For instance, the buffer layer 120 may be formed of silicon nitride ($SiN_x$), silicon oxide ($SiO_2$), and silicon oxynitride ($SiO_xN_y$), and/or the like. However, the buffer layer 120 may not always be desirable, and may be omitted based on the kind of the first substrate 101 and process conditions thereof.

The driving semiconductor layer 132 is formed on the buffer layer 120. The driving semiconductor layer 132 may include at least one semiconductor material selected from a group of polycrystalline silicon, amorphous silicon, and oxide semiconductors. Further, the driving semiconductor layer 132 includes a channel region 135 that is not doped with impurities and p+ doped source and drain regions 136 and 137 that are formed on respective sides of the channel region 135. In this case, p-type impurities, such as boron B, may be used as dopant ions, and $B_2H_6$ may be commonly used. In this regard, such impurities may vary depending on the kinds of the TFT.

A gate insulating layer 140 is formed on the driving semiconductor layer 132. The gate insulating layer 140 may include tetra ethyl ortho silicate (TEOS), silicon nitride ($SiN_x$), silicon oxide ($SiO_2$), and/or the like. For example, the gate insulating layer 140 may have a double-layer structure where a silicon nitride ($SiN_x$) layer having a thickness of about 40 nm and a tetra ethyl ortho silicate (TEOS) layer having a thickness of about 80 nm are sequentially stacked. However, the gate insulating layer 140 according to the present embodiment is not limited to the aforementioned configuration.

The driving gate electrode 155, the gate line 151 (e.g., refer to FIG. 6), and the first storage electrode 158 are formed on the gate insulating layer 140. In this case, the driving gate electrode 155 is formed to overlap at least a portion of the driving semiconductor layer 132. For example, the driving gate electrode 155 may overlap the channel region 135. The driving gate electrode 155 may serve to prevent or substantially prevent the channel region 135 from being doped with impurities when the source and drain regions 136 and 137 of the driving semiconductor layer 132 are doped with the impurities in the forming of the driving semiconductor layer 132.

The driving gate electrode 155 and the first storage electrode 158 may be formed at the same layer, and may include substantially the same metal material. In this case, the metal material may include molybdenum (Mo), chromium (Cr), tungsten (W), and/or the like. For instance, the driving gate electrode 155 and the first storage electrode 158 may include molybdenum (Mo) or molybdenum (Mo) alloys.

The insulating layer 160 is formed on the gate insulating layer 140 to cover the driving gate electrode 155. The insulating layer 160 may be an interlayer insulating layer. The insulating layer 160 may be formed of silicon nitride ($SiN_x$), silicon oxide ($SiO_2$), or the like, which is substantially similar to the gate insulating layer 140. The gate insulating layer 140 and the insulating layer 160 may each have contact holes to respectively expose the source and drain regions 136 and 137 of the driving semiconductor layer 132.

The driving source and drain electrodes 176 and 177, the data line 171, the common power line 172, and the second storage electrode 178 are on the insulating layer 160 of the display area DA. The driving source and drain electrodes 176 and 177 are respectively connected to the source and drain regions 136 and 137 of the driving semiconductor layer 132 through respective contact holes.

Accordingly, the driving TFT 20 may be formed including the driving semiconductor layer 132, the driving gate electrode 155, and the driving source and drain electrodes 176 and 177. However, the configuration of the driving TFT 20 is not limited thereto, and is subject to various suitable modifications.

A passivation layer 180 is formed on the insulating layer 160 to cover the driving source and drain electrodes 176 and 177, and the like. The passivation layer 180 may be formed of organic materials, such as polyacrylate, polyimide, and/or the like. The passivation layer 180 may be a planarization layer.

The passivation layer 180 may define the drain contact hole 181 to expose the driving drain electrode 177.

The first electrode 211 is on the passivation layer 180, and the first electrode 211 is connected to the driving drain electrode 177 through the drain contact hole 181 of the passivation layer 180.

A pixel defining layer 190 is formed on the passivation layer 180 to cover the first electrode 211. The pixel defining layer 190 may have an aperture 199 to expose the first electrode 211.

For example, the first electrode 211 may correspond to the aperture 199 of the pixel defining layer 190. The pixel defining layer 190 may be formed of a resin, such as a polyacrylate resin, a polyimide resin, or the like.

The organic light emitting layer 212 is formed on the first electrode 211 within the aperture 199 of the pixel defining layer 190, and the second electrode 213 may be formed on the pixel defining layer 190 and on the organic light emitting layer 212.

Accordingly, the OLED 210 may be formed including the first electrode 211, the organic light emitting layer 212, and the second electrode 213.

One of the first and second electrodes 211 and 213 may be formed of a transparent conductive material, and the other thereof may be formed of a transflective or reflective conductive material. Depending on the material forming the first and second electrodes 211 and 213, the OLED display device 100 may be a top-emission type, a bottom-emission type, or a both-side-emission type.

For example, when the OLED display device 100 according to the present embodiment is provided in the top-emission type, the first electrode 211 may be formed of the transflective or reflective conductive material, and the second electrode 213 may be formed of the transparent conductive material.

The transparent conductive material may include indium tin oxides (ITO), indium zinc oxides (IZO), zinc oxide (ZnO), and indium oxide ($In_2O_3$), and/or the like. The reflective material may include lithium (Li), calcium (Ca), lithium fluoride/calcium (LiF/Ca), lithium fluoride/aluminum (LiF/Al), aluminum (Al), silver (Ag), magnesium (Mg), and gold (Au), and/or the like.

The organic light emitting layer 212 may be formed of a low molecular weight organic material or a high molecular weight organic material. The organic light emitting layer 212 may have a multi-layer structure including a light emitting layer, and including at least one of a hole injection layer ("HIL"), a hole transporting layer ("HTL"), an electron transporting layer ("ETL"), and/or an electron injection layer ("EIL"). For example, the HIL may be disposed on the first electrode 211, which is a positive end, and the HTL, the light emitting layer, ETL, and EIL may be sequentially stacked thereon.

A capping layer 230 may further be disposed on the second electrode 213. The capping layer 230 may protect the OLED 210, and may serve to allow the light generated in the organic light emitting layer 212 to be efficiently emitted externally.

The OLED display device according to the present embodiment may further include a thin film encapsulation layer 250 on the capping layer 230.

The thin film encapsulation layer 250 includes one or more inorganic layers 251, 253, and 255 and one or more organic layers 252 and 254. The thin film encapsulation layer 250 has a structure in which the inorganic layers 251, 253, and 255 and the organic layers 252 and 254 are alternately stacked. In this case, the inorganic layer 251 may be a lowermost layer of the stacked structure of the thin film encapsulation layer 250. In other words, the inorganic layer 251 may be immediately adjacent the OLED 210. Although FIG. 6 illustrates the thin film encapsulation layer 250 as including the three inorganic layers 251, 253, and 255 and the two organic layers 252 and 254, the present embodiment is not limited thereto.

The inorganic layers 251, 253, and 255 may include $Al_2O_3$, $TiO_2$, ZrO, $SiO_2$, AlON, AlN, SiON, $Si_3N4$, ZnO, and $Ta_2O_5$, and/or the like. The inorganic layers 251, 253, and 255 may be formed through a chemical vapor deposition (CVD) process or an atomic layer deposition (ALD) process. However, the present embodiment is not limited thereto, and the inorganic layers 251, 253, and 255 may be formed through various suitable processes.

The organic layers 252 and 254 may include or be formed of a polymer-based material. Examples of the polymer-based material may include an acrylic resin, an epoxy resin, polyimide, polyethylene, and the like. The organic layers 252 and 254 may be formed through various suitable methods, such as a thermal deposition process.

The inorganic layers 251, 253, and 255 formed to have a high density of a thin film may primarily serve to reduce or effectively prevent infiltration of moisture or oxygen thereinto. The infiltration of moisture or oxygen into the OLED 210 may be largely reduced or prevented by the inorganic layers 251, 253, and 255.

Moisture or oxygen passing through the inorganic layers 251, 253, and 255 may be blocked further by the organic layers 252 and 254. The organic layers 252 and 254 may exhibit relatively low efficiency in preventing the moisture infiltration, as compared to the inorganic layers 251, 253, and 255. However, the organic layers 252 and 254 may also serve as a buffer layer to reduce stress between respective layers of the inorganic layers 251, 253, and 255 and the organic layers 252 and 254, in addition to the prevention or the substantial prevention of the moisture infiltration. Further, because the organic layers 252 and 254 have a planarization property, an uppermost surface of the thin film encapsulation layer 250 may be planarized.

The thin film encapsulation layer 250 may have a thickness of about 10 μm or less. Accordingly, an overall thickness of the OLED display device 102 may be significantly reduced.

In a case where the thin film encapsulation layer 250 is disposed on the OLED 210, an additional substrate may not be provided on the thin film encapsulation layer 250. In a case where the additional substrate is omitted, the flexibility of the display panel 200 may be improved (e.g., increased).

Figure 8:
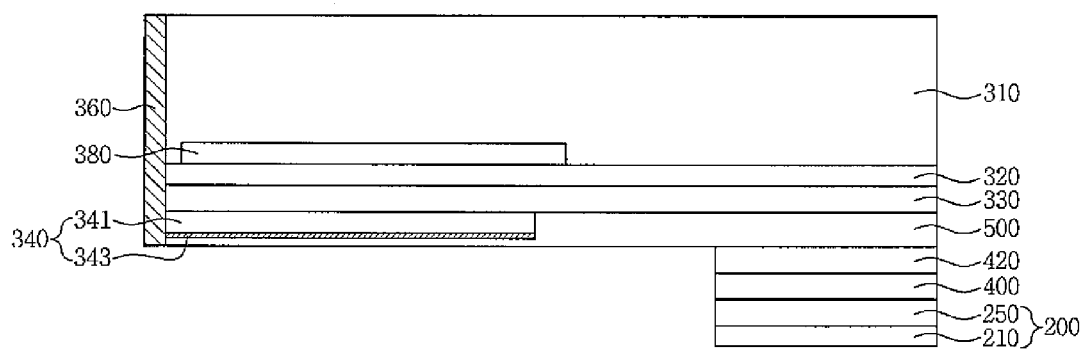
FIG. 8 is a cross-sectional view illustrating a display device according to another exemplary embodiment of the present invention.

FIG. 8 is a cross-sectional view illustrating a display device according to another exemplary embodiment of the present invention.

The display device according to the another exemplary embodiment may have the same configuration as that of the display device illustrated in FIG. 3, except for the position of a low refractive-index zone 380. Accordingly, configurations different from those of the display device illustrated in FIG. 3 will only be described hereinbelow, and the same configurations are represented by the same reference numerals.

In reference to FIG. 8, the low refractive-index zone 380 according to the another exemplary embodiment is disposed on an OCA layer 320.

Figure 10A:
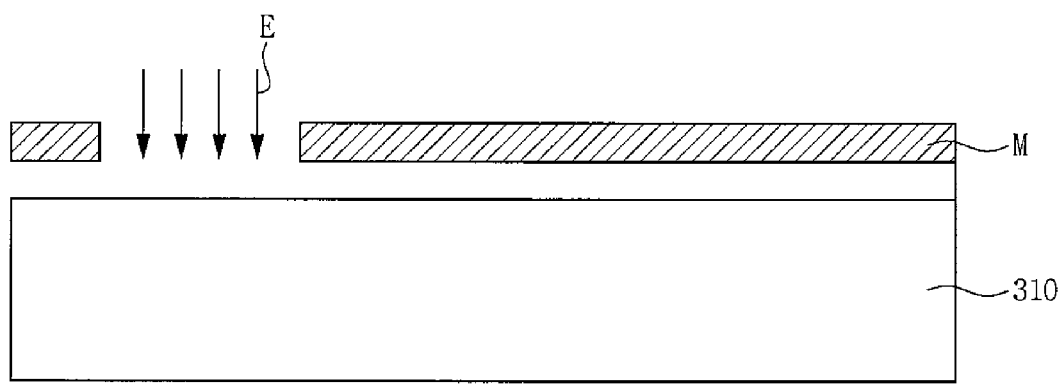
Figure 11A:
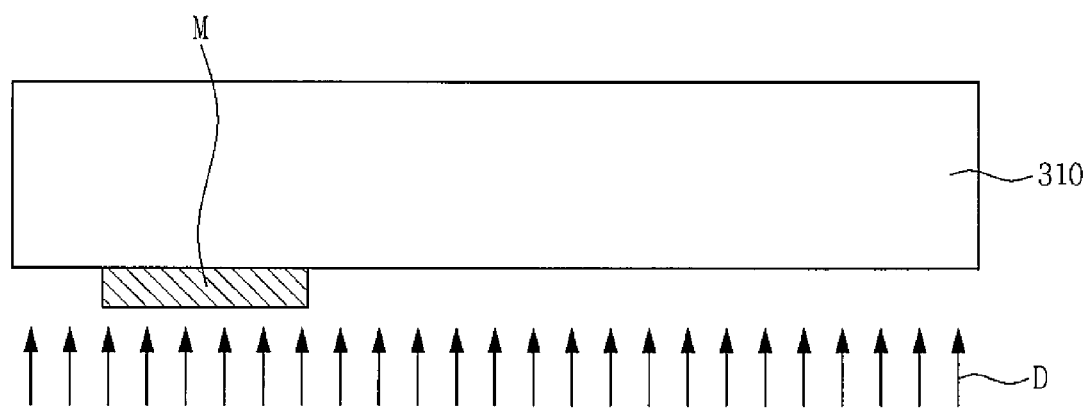

The low refractive-index zone 380 is disposed at an interface between a window base 310 and the OCA layer 320, and the low refractive-index zone 380 may be formed on a lower surface of the window base 310 by performing etching E (e.g., see FIGS. 9A and 10A) or deposition D (e.g., see FIG. 11A).

In further detail, the low refractive-index zone 380 may be formed by etching a portion of a lower surface of the window base 310 by photolithography using a photoresist P, imprinting, and/or using a shadow mask M (e.g., see FIG. 11A). In addition, the low refractive-index zone 380 may be formed by depositing $SiO_2$ and the like on a portion of the lower surface of the window base 310 apart from a portion on which the low refractive-index zone 380 is disposed.

The low refractive-index zone 380 may be desirable (e.g., optically advantageous) when having a thickness of more than about 1 μM, however, the low refractive-index zone 380 may have different thicknesses in a physically feasible range that may prevent direct contact between the low refractive-index zone 380 and a surface of the OCA layer 320.

FIGS. 9A, 9B, 10A, 10B, 11A, and 11B are cross-sectional views illustrating a process of forming the low refractive-index zone 380 of the display device according to the another exemplary embodiment of the present invention.

Figure 9A:
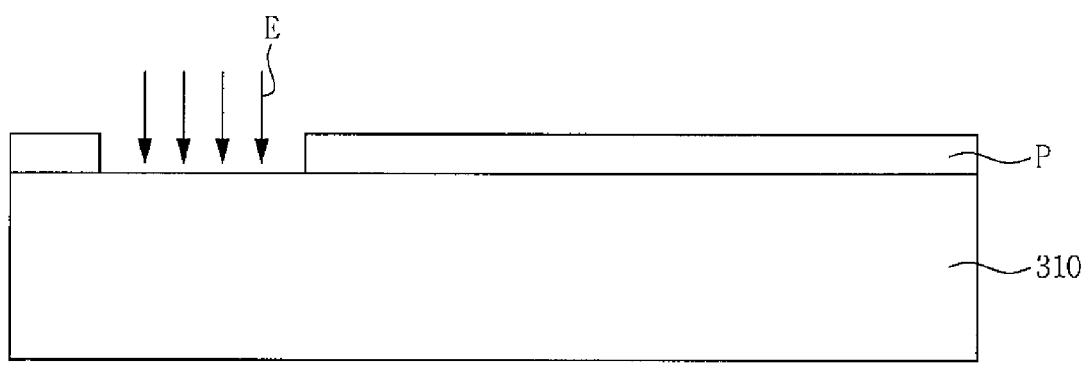
FIGS. 9A-9B, 10A-10B, and 11A-11B are cross-sectional views illustrating a process of forming a low refractive-index zone of the display device according to another exemplary embodiment of the present invention.
Figure 9B:
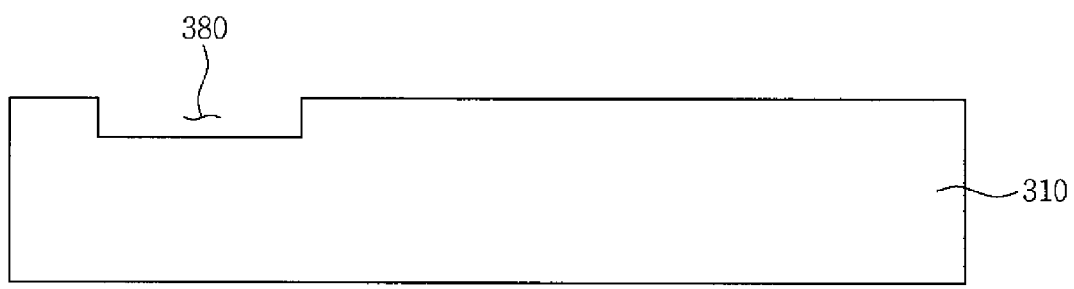

FIGS. 9A and 9B illustrate a process of forming the low refractive-index zone 380 by photolithography according to an exemplary embodiment of the present invention.

In reference to FIG. 9A, the photoresist P is coated on a portion of the lower surface of the window base 310 aside from a portion on which the low refractive-index zone 380 is to be disposed. Subsequently, etching E is performed on a portion omitting the coated photoresist P. Lastly, the coated photoresist P is removed.

As illustrated in FIG. 9B, the window base 310 having the low refractive-index zone 380 on the lower surface of the window base 310, that is, a surface which is to contact the OCA layer 320, is obtained.

Figure 10B:
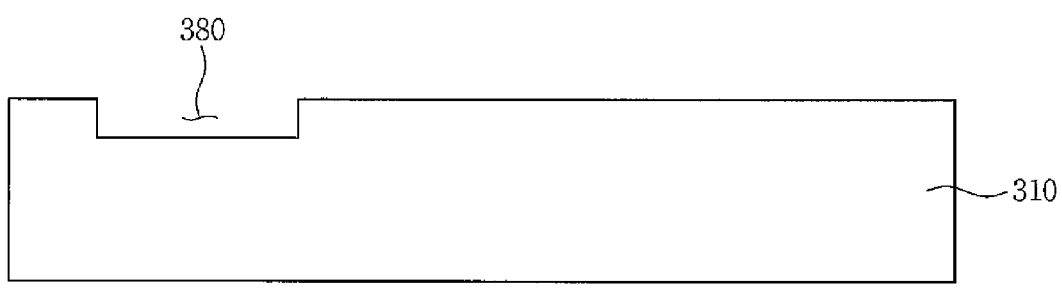

FIGS. 10A and 10B illustrate a process of forming the low refractive-index zone 380 using the shadow mask M.

In reference to FIG. 10A, the shadow mask M is disposed on a portion of the lower surface of the window base 310 aside from a portion on which the low refractive-index zone 380 is to be disposed. Subsequently, etching E is performed on the portion absent the shadow mask M. Lastly, the shadow mask M is removed.

As illustrated in FIG. 10B, the window base 310 having the low refractive-index zone 380 on the lower surface of the window base 310, that is, a surface that is to contact the OCA layer 320, is obtained.

Figure 11B:
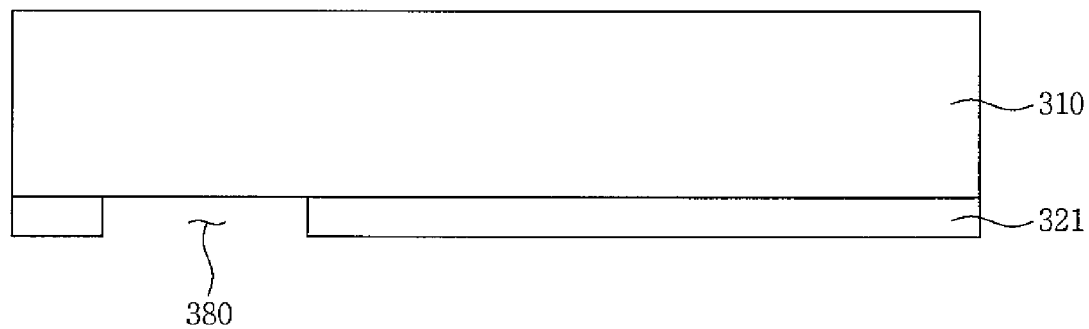

FIGS. 11A and 11B illustrate a process of forming the low refractive-index zone 380 through the deposition D.

In reference to FIG. 11A, a shadow mask M is disposed on a portion of the lower surface of the window base 310 in which the low refractive-index zone 380 is to be disposed. Subsequently, $SiO_2$ is deposited on a portion absent the shadow mask M. Lastly, the shadow mask M is removed.

Examples of the method of deposition may include plasma enhanced chemical vapor deposition PECVD, low pressure chemical vapor deposition (LPCVD), sputtering, electron beam deposition, thermal deposition, and/or the like. In this regard, although $SiO_2$ is described as an example of the deposition material, the present invention is not limited thereto. Any material forming the window base 310 may be applicable.

As illustrated in FIG. 11B, the low refractive-index zone 380 is formed by a step difference between the deposited $SiO_2$ layer 321 and the window base 310. Accordingly, the window base 310 having the low refractive-index zone 380 on the lower surface of the window base 310, that is, a surface that is to contact the OCA layer 320, is obtained. As compared to the low refractive-index zone 380 formed by etching E, the low refractive-index zone 380 formed by deposition D has a smoother surface, which is more desirable (e.g., optically advantageous).

After disposing the OCA layer 320, the base film 330, and the printed layer 340 on the window base 310 on which the low refractive-index zone 380 is disposed, the display panel including the OLED 210, the thin film encapsulation layer 250, the polarizer 400, the touch screen panel 420, and the like is adhered to the window base 310 using the adhesive layer 500, the display device according to the another exemplary embodiment may be formed.

Accordingly, the low refractive-index zone 380 of the display device according to the embodiment illustrated in FIG. 8 is disposed at an interface between the window base 310 and the OCA layer 320 so as to totally reflect the totally reflected light being incident thereto once again, thus changing the light path and reducing the light leakage.

Figure 12:
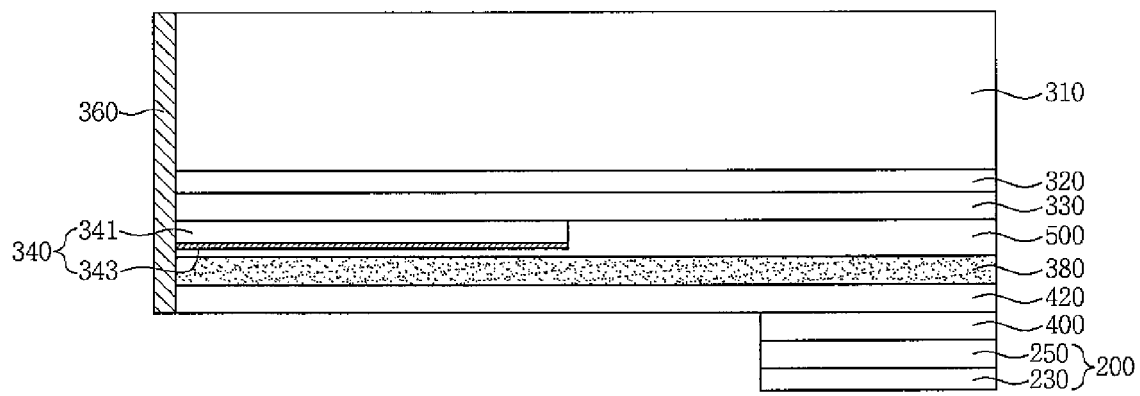
FIG. 12 is a cross-sectional view illustrating a display device according to yet another exemplary embodiment of the present invention.

FIG. 12 is a cross-sectional view illustrating a display device according to yet another exemplary embodiment of the present invention.

The display device according to the present embodiment is the same as the display device illustrated in FIG. 3, except for the position and disposing manner of a low refractive-index zone 380. Accordingly, the same configurations are represented by the same reference numerals, and the repeated description may be omitted for brevity.

The low refractive-index zone 380 according to the present embodiment is disposed between the display panel 200 and the adhesive layer 500.

In reference to FIG. 12, the low refractive-index zone 380 is a layer including a material having a low refractive index, and may be disposed over an entire surface between the touch screen panel 420 and the adhesive layer 500.

An example of the material having a low refractive index may be aerogel. The aerogel is a solid material in which air accounts for about 98% or more, and has a considerably low refractive index of about 1.01 or less.

In FIG. 12, the low refractive-index zone 380 is disposed over an entire surface thereof, however, the present invention is not limited thereto. In an alternative exemplary embodiment, the low refractive-index zone 380 may be disposed in a portion thereof instead of being disposed in the entire surface thereof. However, in terms of efficiency of reducing light leakage, it is desirable that the low refractive-index zone 380 be disposed on the entire surface thereof.

The low refractive-index zone 380 of the display device according to the present embodiment is disposed between the display panel 200 and the adhesive layer 500 to change a path of light that is generated in the OLED 210 and totally-reflected. That is, the totally reflected light reflected from the low refractive-index zone 380 to have a changed light path is absorbed by the polarizer 400, and thereby the light leakage may be reduced.

Hereinafter, the effect of light leakage improvement (e.g., the effect of light leakage reduction) of the display device according to the present invention will be described with reference to FIGS. 13, 14, and 15.

Figure 13:
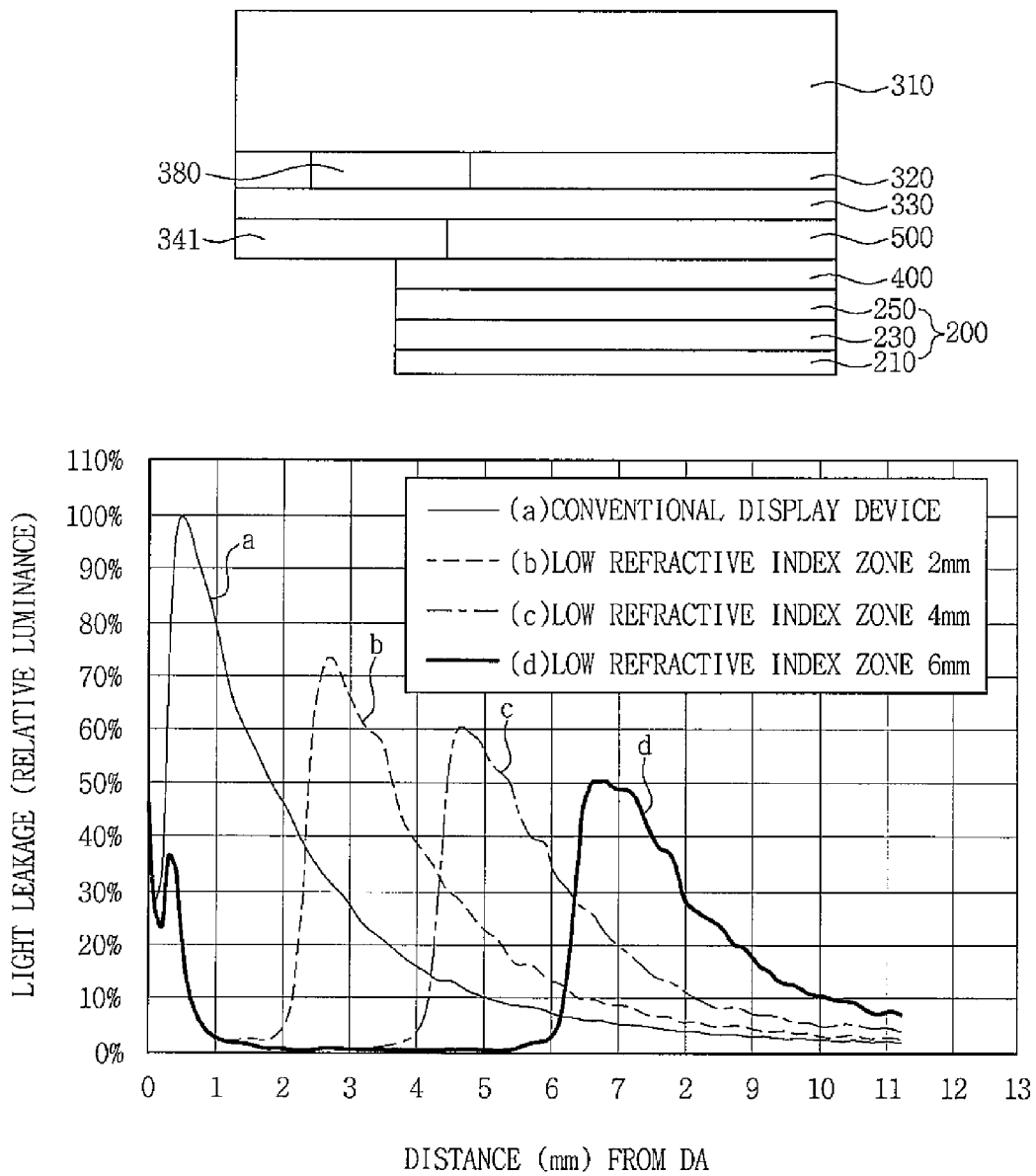
FIG. 13 is a graph illustrating a simulation result of light leakage improvement in a display device according to an exemplary embodiment of the present invention.

FIG. 13 is a graph comparing the light leakage level between a related display device and the display device according to the present embodiment.

The graph illustrates a result from measurement of a relative luminance in a direction perpendicular to an upper surface in the non-display area NDA. An x-axis represents a distance (mm) from the display area DA, and a y-axis represents a light leakage level (relative luminance as a percentage).

FIG. 13 illustrates a simulation result with a display device where the low refractive-index zone 380 is on the same layer as the OCA layer 320, and where the OCA layer 320 has a refractive index of about 1.47.

The simulation is carried out with a related display device absent the low refractive-index zone and display devices including the low refractive-index zone having widths of about 2 mm, about 4 mm, and about 6 mm, respectively, and the results are respectively illustrated as graphs (a), (b), (c), and (d).

In reference to the graph in FIG. 13, when a maximum light leakage level of the related/conventional display device (a) at a distance of about 0.5 mm is set to be 100%, the display device having the low refractive-index zone having a width of about 2 mm (b) shows a maximum light leakage level of about 73% at a distance of about 2.8 mm, the display device having the low refractive-index zone having a width of about 4 mm (c) shows a maximum light leakage level of about 60% at a distance of about 4.7 mm, and the display device having the low refractive-index zone having a width of about 6 mm (d) shows a maximum light leakage level of about 50% at a distance of about 6.5 mm. In other words, it is verified that when the width of the low refractive-index zone is about 2 mm, about 4 mm, and about 6 mm, the maximum light leakage is improved (e.g., reduced) by about 27%, about 40%, and about 50%, respectively, when compared to that of the related/conventional display device.

Accordingly, it is appreciated that the maximum light leakage is improved (e.g., reduced) by 50% in the display device according to the present invention, when compared to that of the related display device.

Figure 14A:
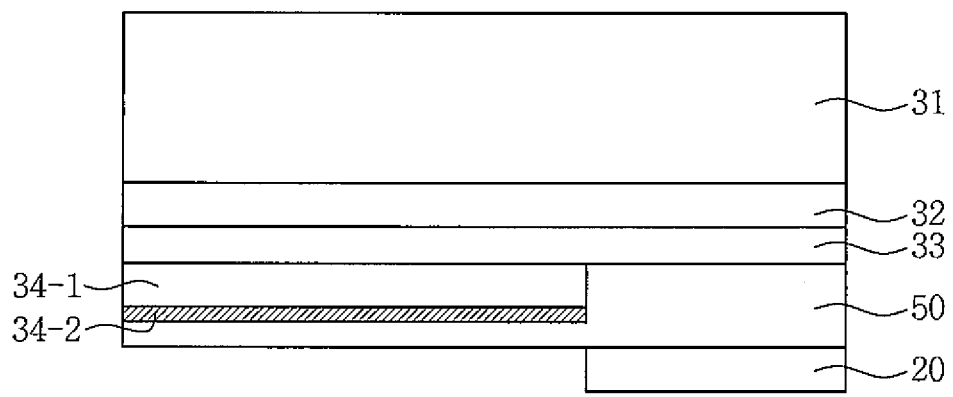
FIG. 14A is a cross-sectional view illustrating the related display device.
Figure 14B:
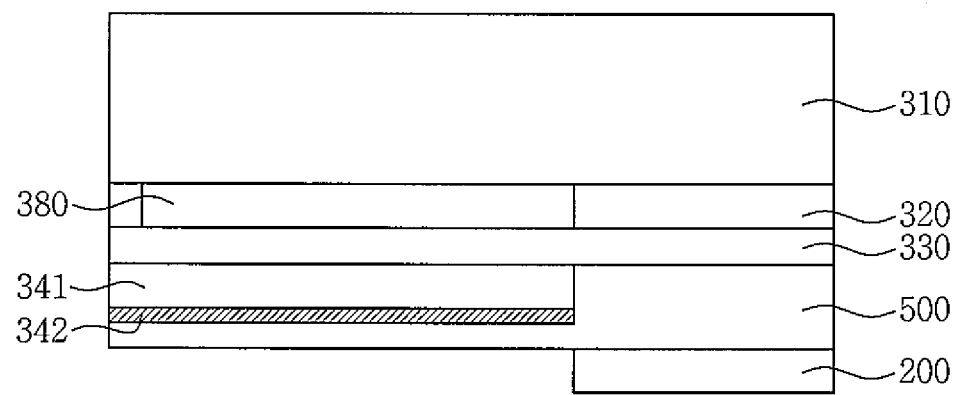
FIG. 14B is a cross-sectional view illustrating the display device according to an exemplary embodiment.
Figure 14C:
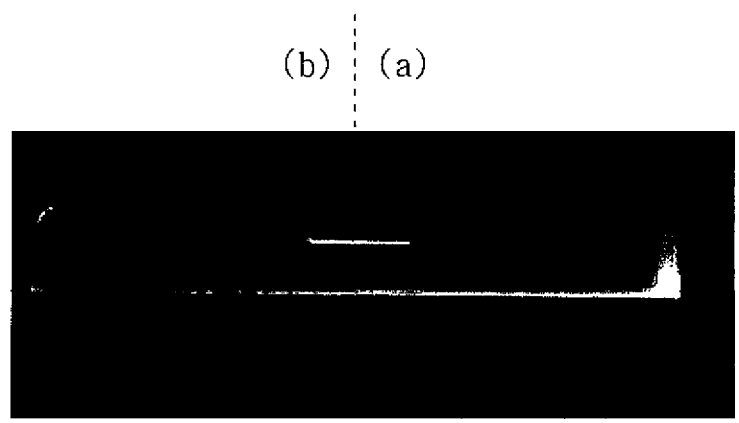
FIG. 14C is a photograph illustrating a comparison of a light leakage level between the related display device and the display device according to an embodiment of the present invention.
Figure 15:
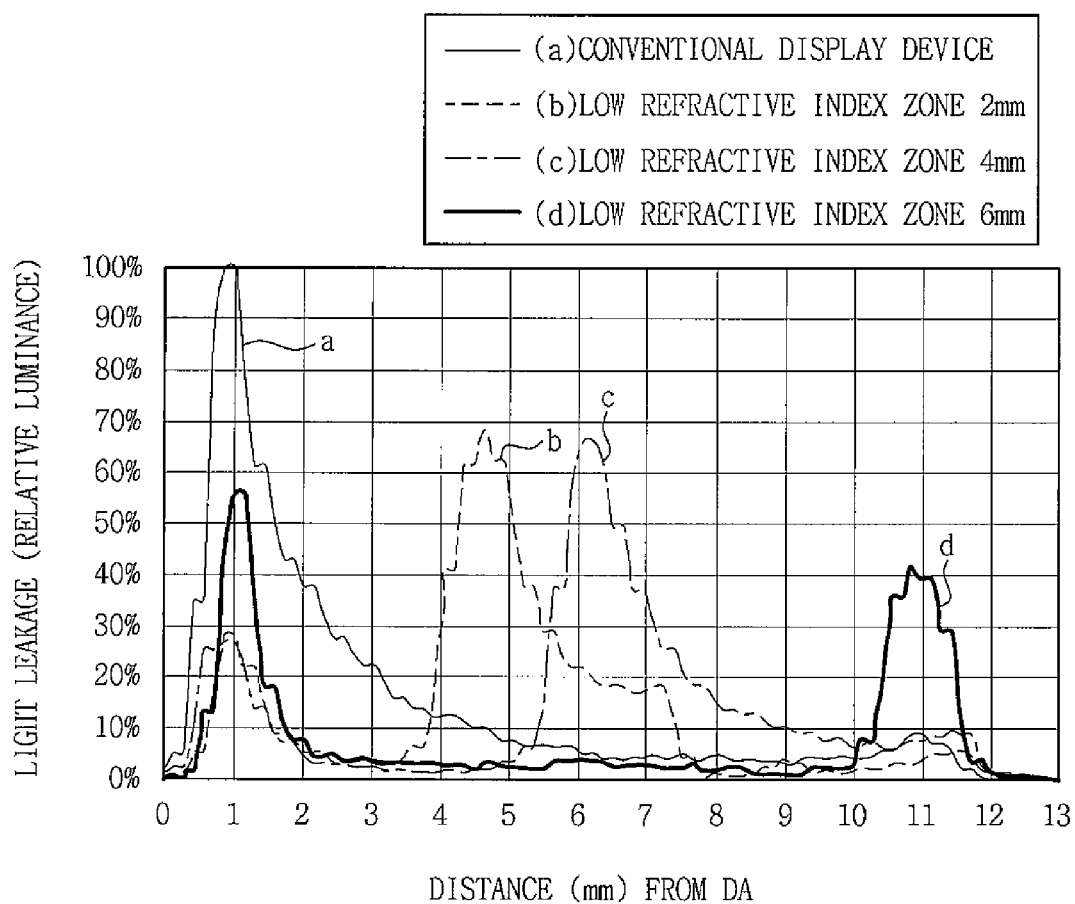
FIG. 15 is a graph illustrating a result from the experiment of FIG. 14.

FIGS. 14 and 15 are results from an experiment comparing the light leakage level between the related display device and the display device according to the present embodiment.

FIG. 14A is a cross-sectional view illustrating the related display device, and FIG. 14B is a cross-sectional view illustrating the display device according to the present embodiment. FIG. 14C is a photograph illustrating a comparison of the light leakage level between the related display device (a) and the display device according to the present invention (b).

In reference to FIGS. 14A and 14B, as compared to the related display device (FIG. 14A), the display device according to the present invention (FIG. 14B) further includes the low refractive-index zone 380 that is disposed on the same layer as a layer on which the OCA layer 320 is disposed.

In reference to FIG. 14C, a structure including the low refractive-index zone, as in the display device according to the present invention, is provided on the left side, and a structure absent the low refractive-index zone, as in the related display device is provided on the right side, is provided on the right side, and the level of light leakage is observed. While light leakage is hardly observed in a non-display area in the left side, light leakage is observed in a non-display area in the right side, with respect to a center line of FIG. 14C.

Accordingly, it may be verified from the result that the display device according to the present invention may be improved in, or prevented from, the light leakage phenomenon, by including the low refractive-index zone 380.

FIG. 15 is a graph illustrating the result from the experiment of FIG. 14, and the graph shows a result from measurement of luminance based on the light leakage.

The graph illustrated in FIG. 15 is the result from measurement of relative luminance in a direction perpendicular to an upper surface in the non-display area NDA, as the graph in FIG. 13. An x-axis represents a distance (mm) from the display area DA, and a y-axis represents a light leakage level (relative luminance as a percentage).

A luminance is measured in a related/conventional display device omitting the low refractive-index zone (e.g., refer to FIG. 14A), and measured in display devices including the low refractive-index zone having widths of about 4 mm, about 6 mm, and about 10 mm (e.g., refer to FIG. 14B), respectively, and the results are respectively illustrated as graphs (a), (b), (c), and (d).

In reference to a graph in FIG. 15, when a maximum light leakage level of the related/conventional display device (a) at a distance of about 0.8 mm is set to be 100%, the display device having the low refractive-index zone having a width of about 4 mm (b) shows a maximum light leakage level of about 68% at a distance of about 4.6 mm, the display device having the low refractive-index zone having a width of about 6 mm (c) shows a maximum light leakage level of about 66% at a distance of about 6.2 mm, and the display device having the low refractive-index zone having a width of about 10 mm (d) shows a maximum light leakage level of about 40% at a distance of about 10.8 mm. In other words, it is verified that when the width of the low refractive-index zone is about 4 mm, about 6 mm, and about 10 mm, the maximum light leakage is improved (e.g., reduced) by about 32%, about 34%, and about 60%, respectively, as compared to the related display device.

Accordingly, it is appreciated from the result that the light leakage is improved (e.g., reduced) to a maximum light leakage of about 60% in the display device according to the present invention, as compared to the related display device.

As set forth above, according to exemplary embodiments, the low refractive-index zone is provided in the window, such that light reaching the printed layer through total reflection may be reduced.

Accordingly, exemplary embodiments of the present invention may provide a display device improved in terms of light leakage phenomenon (e.g., a display device exhibiting a reduction in light leakage).

From the foregoing, it will be appreciated that various embodiments in accordance with the present disclosure have been described herein for purposes of illustration, and that various modifications may be made without departing from the scope and spirit of the present teachings, as defined by the appended claims and equivalents thereof. Accordingly, the various embodiments disclosed herein are not intended to be limiting of the true scope and spirit of the present teachings. Various features of the above-described and other embodiments can be mixed and matched in any suitable manner, to produce further embodiments consistent with the invention.

What is claimed is:

1. A display device comprising:
   a display panel configured to display an image;

a window above the display panel and having a display area configured to transmit an image therethrough and a non-display area around the display area, the window comprising:
  a window base facing the display panel;
  a printed layer below the window base; and
  a low refractive-index zone between the window base and the printed layer; and
an adhesive layer between the display panel and the window,
wherein the printed layer is at the non-display area, and contacts the adhesive layer.

2. The display device of claim 1, wherein the low refractive-index zone comprises an air layer.

3. The display device of claim 1, wherein the window further comprises a base film between the window base and the printed layer.

4. The display device of claim 3, wherein the window further comprises an optically clear adhesive ("OCA") layer between the window base and the base film.

5. The display device of claim 4, wherein the low refractive-index zone is at a same layer as the OCA layer.

6. The display device of claim 4, wherein the low refractive-index zone is above the OCA layer.

7. The display device of claim 1, wherein the low refractive-index zone is between the display panel and the adhesive layer.

8. The display device of claim 7, wherein the low refractive-index zone covers an entire surface of the adhesive layer.

9. The display device of claim 1, wherein the low refractive-index zone comprises a material having a low refractive index.

10. The display device of claim 1, further comprising a light absorbing member on a side surface of the window.

11. The display device of claim 10, wherein the light absorbing member comprises a base resin, a light absorbing material, and a UV-curing accelerator.

12. A display device comprising:
  a display panel configured to display an image;
  a window above the display panel and having a display area configured to transmit an image therethrough and a non-display area around the display area, the window comprising:
    a window base facing the display panel;
    a printed layer below the window base; and
    a low refractive-index zone between the window base and the printed layer; and
  an adhesive layer between the display panel and the window,
  wherein the printed layer comprises a first decor printed layer, and a light blocking printed layer.

13. The display device of claim 12, wherein the light blocking printed layer contacts the adhesive layer.

14. The display device of claim 12, wherein the first decor printed layer comprises a white printed layer.

15. The display device of claim 12, wherein the light blocking printed layer comprises a black printed layer.

16. A display device comprising:
  a display panel configured to display an image;
  a window above the display panel and having a display area configured to transmit an image therethrough and a non-display area around the display area, the window comprising:
    a window base facing the display panel;
    a printed layer below the window base; and
    a low refractive-index zone between the window base and the printed layer; and
  an adhesive layer between the display panel and the window,
  wherein the display panel comprises:
    a first substrate;
    a capping layer on the first substrate; and
    a thin film encapsulation ("TFE") layer on the capping layer.

17. The display device of claim 16, further comprising a polarizer on the TFE layer, and facing the window base.

18. The display device of claim 17, wherein the adhesive layer is between the polarizer and the window.

19. The display device of claim 17, further comprising a touch screen panel ("TSP") on the polarizer.

* * * * *